(12) United States Patent
Lee et al.

(10) Patent No.: US 12,176,335 B2
(45) Date of Patent: Dec. 24, 2024

(54) SEMICONDUCTOR DEVICE AND METHOD USING TAPE ATTACHMENT

(71) Applicant: STATS ChipPAC Pte. Ltd., Singapore (SG)

(72) Inventors: GunHyuck Lee, Incheon (KR); SangHyun Son, Seoul (KR); Yujeong Jang, Incheon (KR); Hyeoneui Lee, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 415 days.

(21) Appl. No.: 17/649,005

(22) Filed: Jan. 26, 2022

(65) Prior Publication Data

US 2023/0238376 A1    Jul. 27, 2023

(51) Int. Cl.
*H01L 21/683* (2006.01)
*H01L 21/48* (2006.01)
*H01L 21/56* (2006.01)
*H01L 25/00* (2006.01)
*H01L 25/10* (2006.01)

(52) U.S. Cl.
CPC .......... *H01L 25/50* (2013.01); *H01L 21/4846* (2013.01); *H01L 21/4853* (2013.01); *H01L 21/568* (2013.01); *H01L 21/6835* (2013.01); *H01L 25/105* (2013.01); *H01L 2221/68359* (2013.01); *H01L 2225/1023* (2013.01); *H01L 2225/1041* (2013.01); *H01L 2225/1058* (2013.01)

(58) Field of Classification Search
CPC . H01L 25/50; H01L 21/4846; H01L 21/4853; H01L 21/568; H01L 21/6835; H01L 25/105; H01L 2221/68359; H01L 2225/1023; H01L 2225/1041; H01L 2225/1058; H01L 24/11; H01L 24/13; H01L 24/81; H01L 23/49816; H01L 23/5389; H01L 24/16; H01L 24/32; H01L 2224/73204; H01L 2225/1035; H01L 23/552; H01L 21/50; H01L 21/56; H01L 25/18; H01L 24/50; H01L 23/12; H01L 23/28; H01L 23/3128; H01L 24/79
USPC ...................................................... 257/522
See application file for complete search history.

(56) References Cited

U.S. PATENT DOCUMENTS

| | | | | |
|---|---|---|---|---|
| 6,879,047 B1 * | 4/2005 | Heo | ........................ | H01L 25/03 257/737 |
| 7,851,261 B2 * | 12/2010 | Chai | .................... | H01L 25/0657 438/109 |
| 8,210,716 B2 * | 7/2012 | Lerman | .................... | F21K 9/00 362/249.02 |

(Continued)

*Primary Examiner* — Vu A Vu
(74) *Attorney, Agent, or Firm* — Brian M. Kaufman; Robert D. Atkins; PATENT LAW GROUP: Atkins and Associates, P.C.

(57) ABSTRACT

A semiconductor device has a first semiconductor package including a substrate and an encapsulant deposited over the substrate. An adhesive tape is disposed on the encapsulant. A conductive via is formed by trench cutting through the adhesive tape and encapsulant to expose the substrate. A second semiconductor package is disposed over the adhesive tape opposite the first semiconductor package. The first semiconductor package and second semiconductor package are bonded together by the adhesive tape.

19 Claims, 14 Drawing Sheets

(56) References Cited

U.S. PATENT DOCUMENTS

| | | | |
|---|---|---|---|
| 8,519,544 B2* | 8/2013 | Kim | H01L 24/24 |
| | | | 257/788 |
| 9,048,222 B2* | 6/2015 | Hung | H01L 23/5384 |
| 9,048,233 B2* | 6/2015 | Wu | H01L 21/486 |
| 9,214,452 B2* | 12/2015 | Kim | H01L 25/065 |
| 10,170,409 B2* | 1/2019 | Ganesan | H01L 21/76877 |
| 10,510,732 B2* | 12/2019 | Tsou | H01L 23/5384 |
| 11,037,861 B2* | 6/2021 | Hung | H01L 25/105 |
| 11,342,297 B2* | 5/2022 | Chen | H01L 24/11 |
| 11,600,575 B2* | 3/2023 | Jeng | H01L 23/5389 |
| 11,854,927 B2* | 12/2023 | Tseng | H01L 23/3185 |
| 11,908,692 B2* | 2/2024 | Chen | H01L 23/544 |
| 2018/0096974 A1 | 4/2018 | Lin | |
| 2019/0013299 A1* | 1/2019 | Lee | H01L 25/105 |
| 2021/0020560 A1 | 1/2021 | Wang et al. | |
| 2021/0343652 A1 | 11/2021 | Jeng et al. | |

* cited by examiner

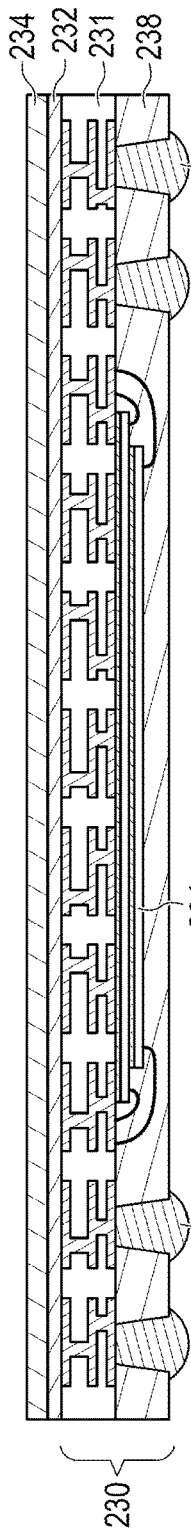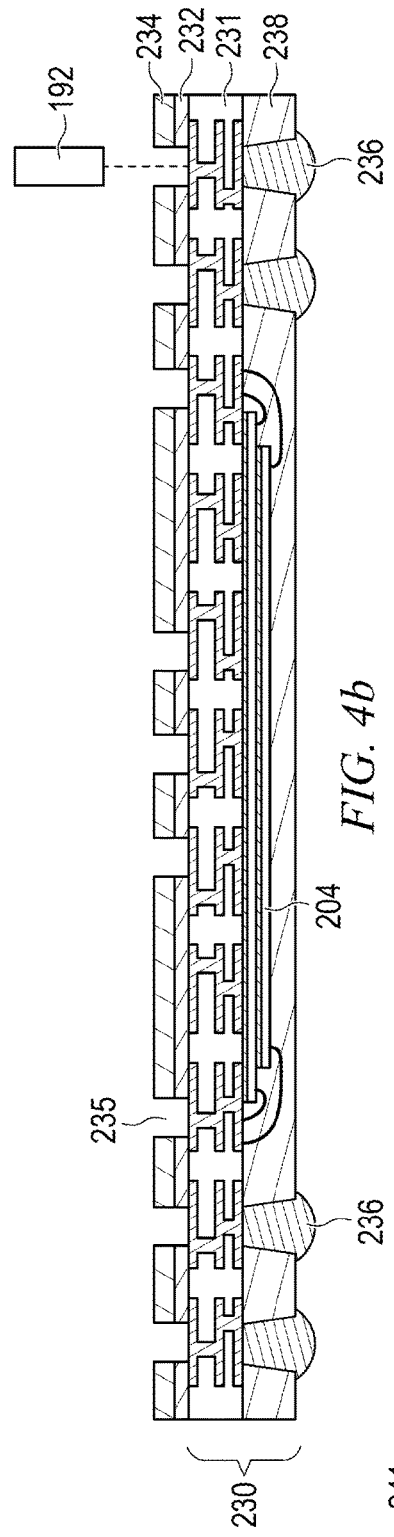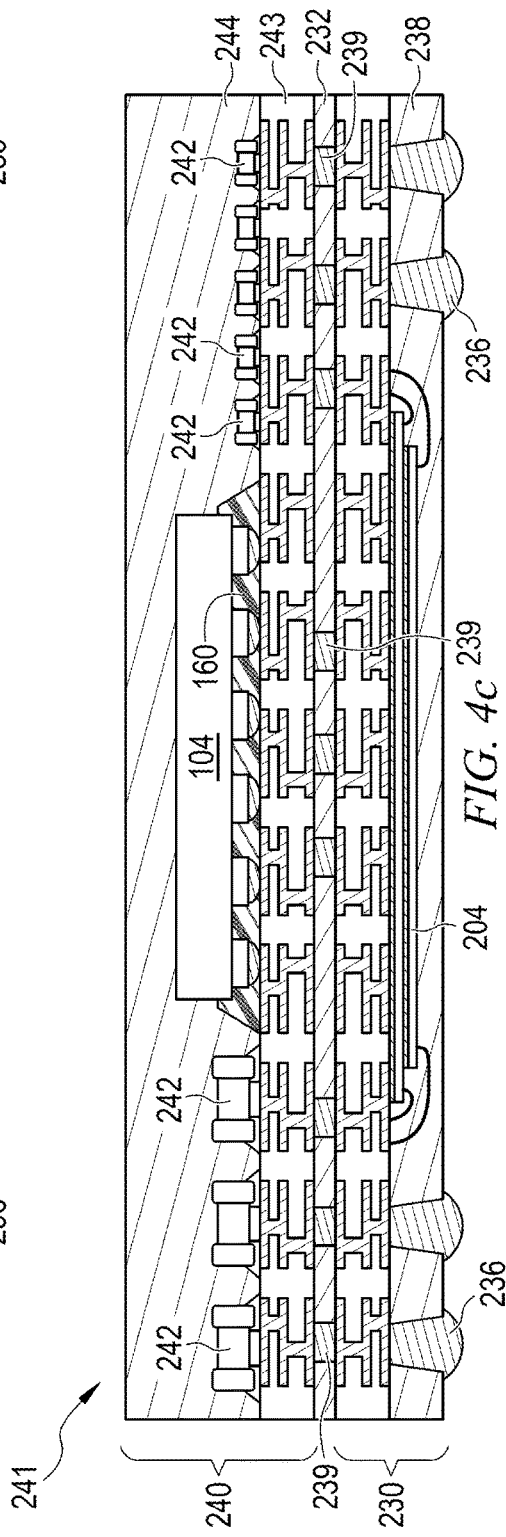

SEMICONDUCTOR DEVICE AND METHOD USING TAPE ATTACHMENT

FIELD OF THE INVENTION

The present invention relates in general to semiconductor devices and, more particularly, to a semiconductor device and method using tape attachment.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages are becoming more and more complex to meet demands from electronic device manufacturers and consumers. Manufacturing process difficulty is continuously increasing to form more complex structures using the same old methods. Various devices are being added to improve warpage characteristics, but also add significant manufacturing complexity. Therefore, a need exists for a simplified package and manufacturing method that can be used for complex packages.

BRIEF DESCRIPTION OF THE DRAWINGS

FIGS. 4a-4c illustrate forming a double-sided package with tape attachment;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
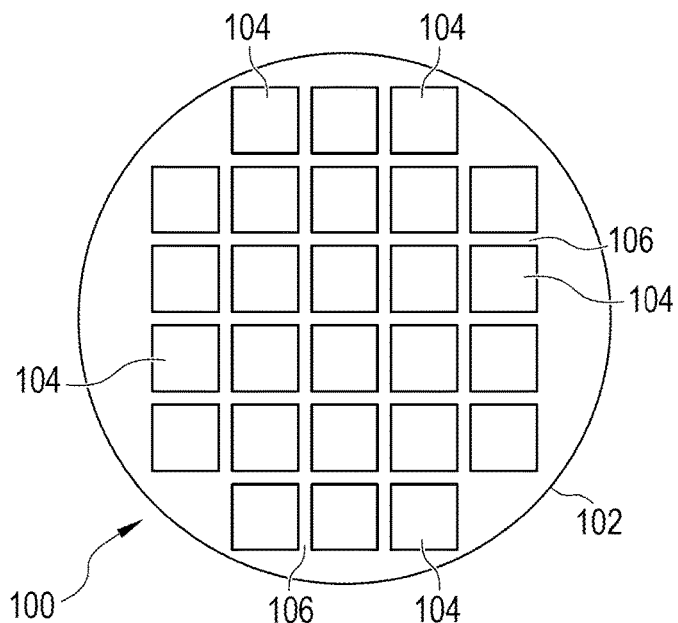
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
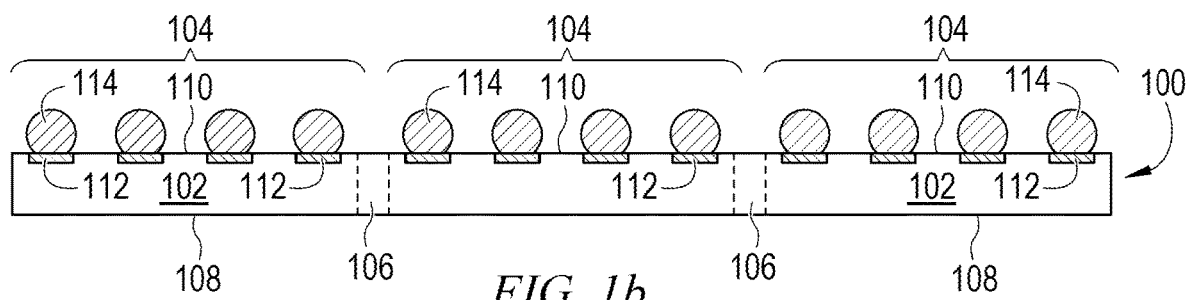

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. The bump material can be reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

Figure 1C:
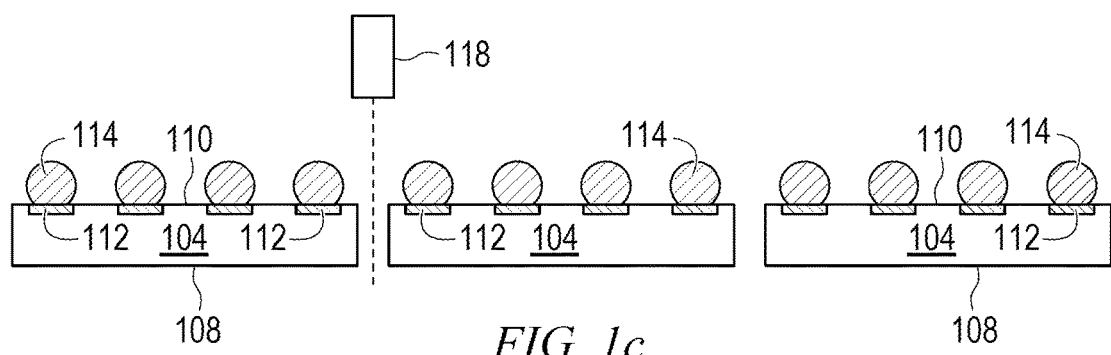

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Figure 2A:
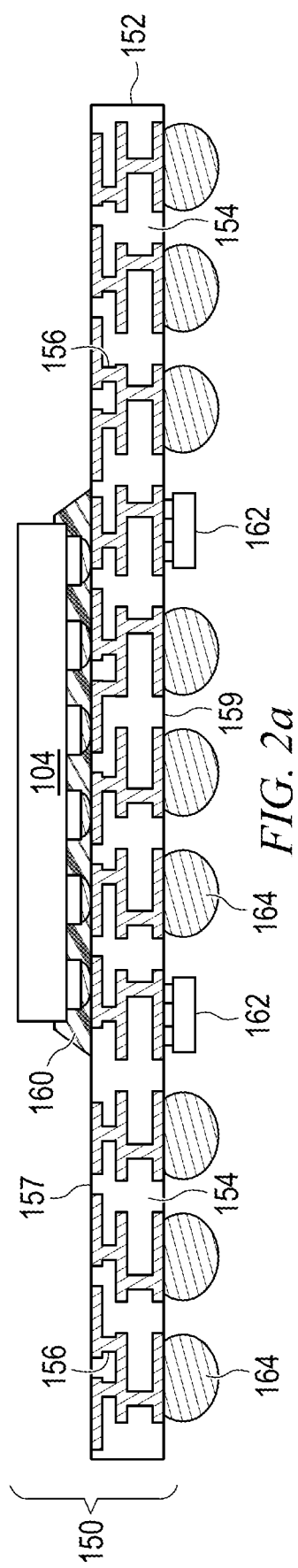
FIGS. 2a-2i illustrate forming a package-on-package semiconductor device using tape attachment.

FIGS. 2a-2i show forming a package-on-package (PoP) device with semiconductor die 104 using tape attachment. In FIG. 2a, a package-on-package bottom (PoPb) 150 is in the process of being formed on substrate 152. Substrate 152 can be a unit substrate singulated from a larger panel or remain as part of a larger substrate panel. Hundreds or thousands of packages are commonly formed in a single substrate panel, or on a common carrier with unit substrates, using the same steps described herein for a single unit but performed en masse.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Any components desired to implement the intended functionality of PoPb 150 are mounted to or disposed over substrate 152 and electrically connected to conductive layers 156. Substrate 152 has two major surfaces: top surface 157 and bottom surface 159. Electrical components can be mounted onto top surface 157 and bottom surface 159 in any suitable configuration.

Semiconductor die 104 is mounted to surface 157 of substrate 152 in FIG. 2a using a pick and place or other suitable operation. A mold under-fill (MUF) 160 is deposited between semiconductor die 104 and substrate 152. MUF 160 can be deposited on substrate 152 or semiconductor die 104 before mounting or injected between the two by capillary action after mounting. Additional electrical components 162 are mounted onto bottom surface 159. Electrical components 162 can also be mounted onto top surface 157 along with semiconductor die 104. Any combination of electrical components, such as semiconductor die or discrete active or passive components can be mounted onto surfaces 157 and 159 in any desired combination. Bumps 164 are formed on bottom surface 159 in a similar manner as bumps 114 were formed on semiconductor die 104. Bumps 164 can be any suitable type of interconnect structure and formed at any stage of manufacturing.

Figure 2B:
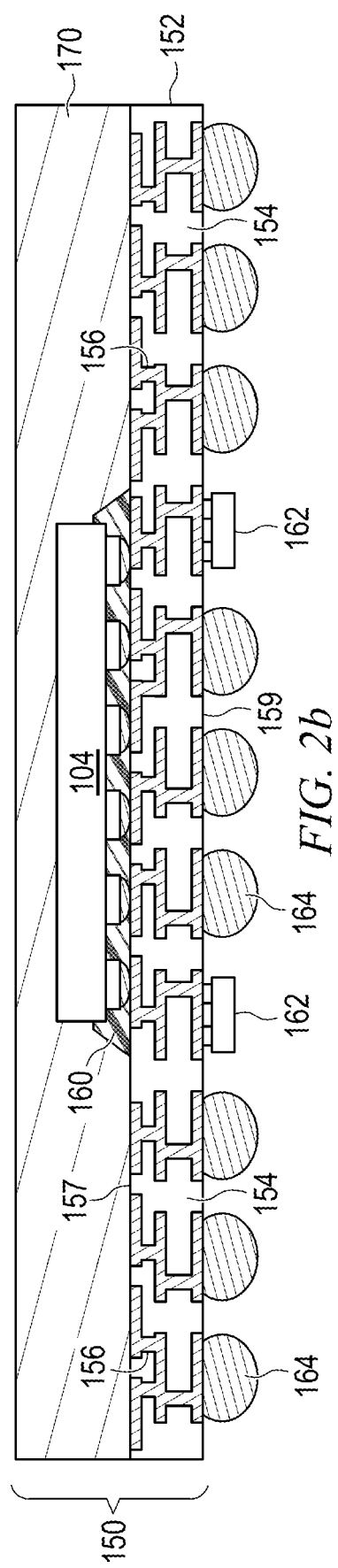

Encapsulant 170 is deposited over substrate 152 and semiconductor die 104 in FIG. 2b. Encapsulant 170 can be a polymer composite material, such as an epoxy resin, epoxy acrylate, or polymer with or without a filler added. Encapsulant 170 is non-conductive and environmentally protects the semiconductor device from external elements and contaminants. Encapsulant 170 also protects semiconductor die 104 from degradation due to exposure to light.

Figure 2C:
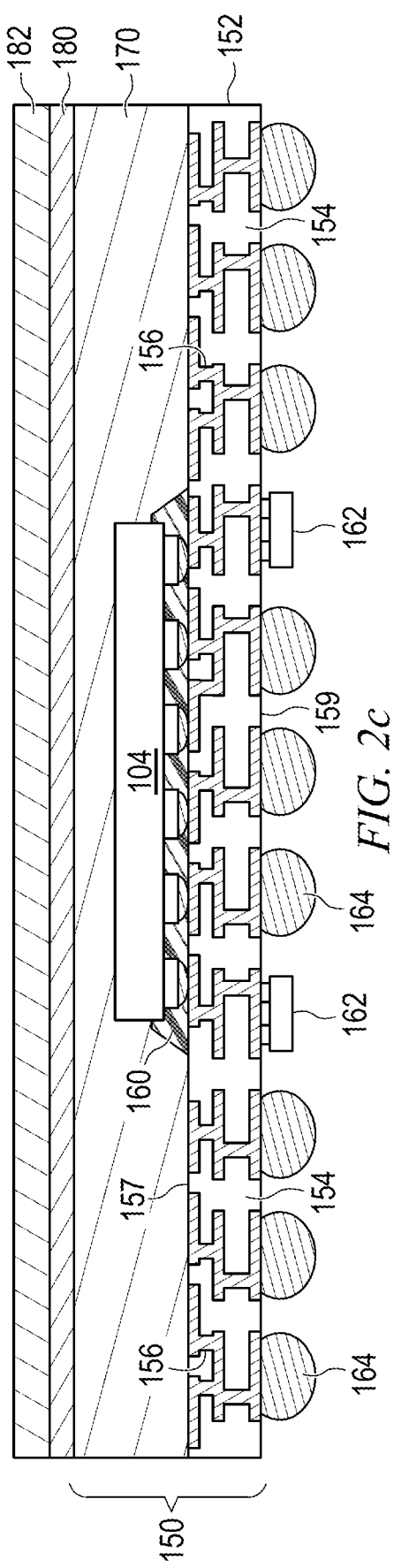

In FIG. 2c, an adhesive tape 180 is disposed over encapsulant 170. Adhesive tape 180 includes a tape or film material, such as polyimide (PI) or aluminum (Al), as a substrate with an adhesive coated onto the top and bottom surfaces of the tape. Polyimide is convenient as an insulating material that will not short circuit electrical contacts. Aluminum has excellent thermal conductivity and can improve heating or cooling efficiency. Aluminum can protect plastic parts from heat and can increase the brightness of light by reflecting light from a light source. Aluminum protects the surface of encapsulant 170 from damage caused by heat or fire. Noise can be reduced due to the Aluminum reducing vibrations. Aluminum has great flexibility and can be applied to curved areas. High tensile strength and high tear resistance are also beneficial qualities of aluminum for adhesive tape 180. Because aluminum has electrical conductivity, it can operate as an electromagnetic interference (EMI) shield between layers of the package-on-package. In one embodiment, adhesive tape 180 is formed using a high-purity aluminum. In another embodiment, adhesive tape 180 is a die-attach film (DAF).

A cover or backing tape 182 is disposed onto one surface of adhesive tape 180 to prevent the top adhesive surface of the tape from being exposed during processing. In FIG. 2c, adhesive tape 180 is adhered to encapsulant 170 by an adhesive on the bottom surface of tape 180, and tape 180 is adhered to cover tape 182 by adhesive on the top surface of tape 180. Silicone is used as the adhesive in one embodiment.

Figure 2D:
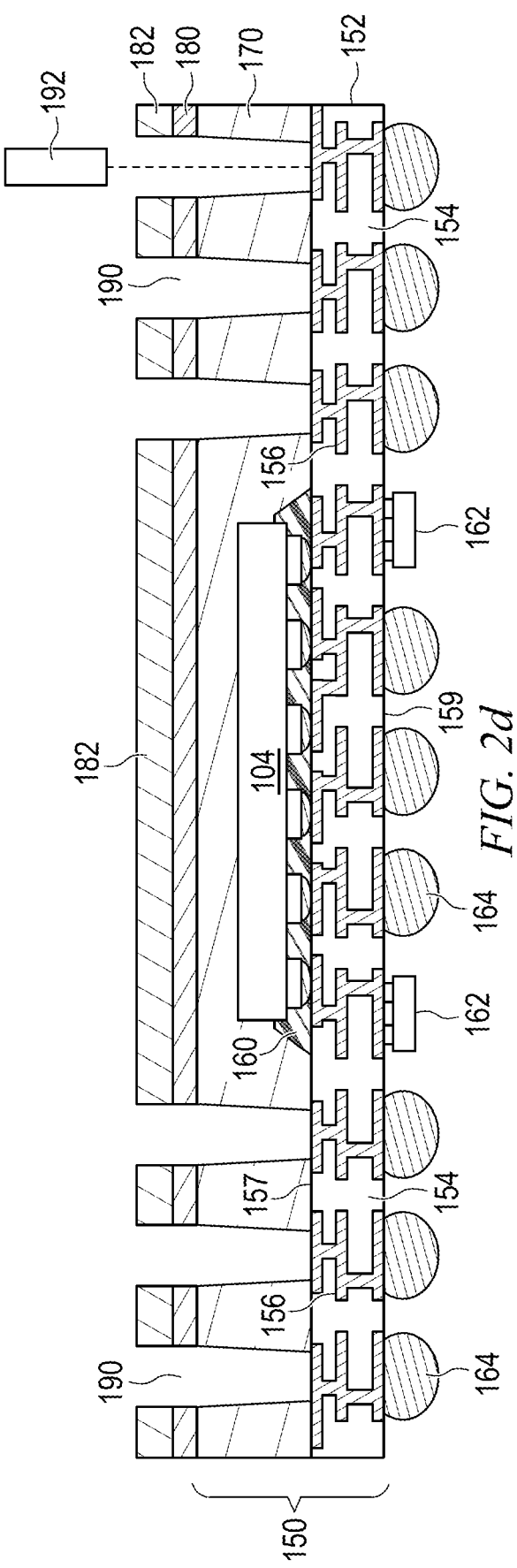

In FIG. 2d, via openings 190 are trench-cut through cover tape 182, adhesive tape 180, and encapsulant 170 using a laser cutting tool 192. Laser cutting tool 192 is an infra-red or ultra-violet laser in some embodiments. The trench cut process drills through only adhesive tape 180, cover tape 182, and encapsulant 170 to expose contact pads of substrate 152. Trench cutting with laser cutting tool 192 is faster than traditional TSV technology and allows a higher aspect ratio for via openings 190, i.e., taller and thinner openings can be formed. Trench cutting allows for the use of smaller conductive pads on substrate 152 and thicker encapsulant 170. In some embodiments, particularly when adhesive tape 180 is conductive, portions of tapes 180 and 182 around via openings 190 are also removed to create a physical separation between adhesive tape 180 and via openings 190.

Figure 2E:
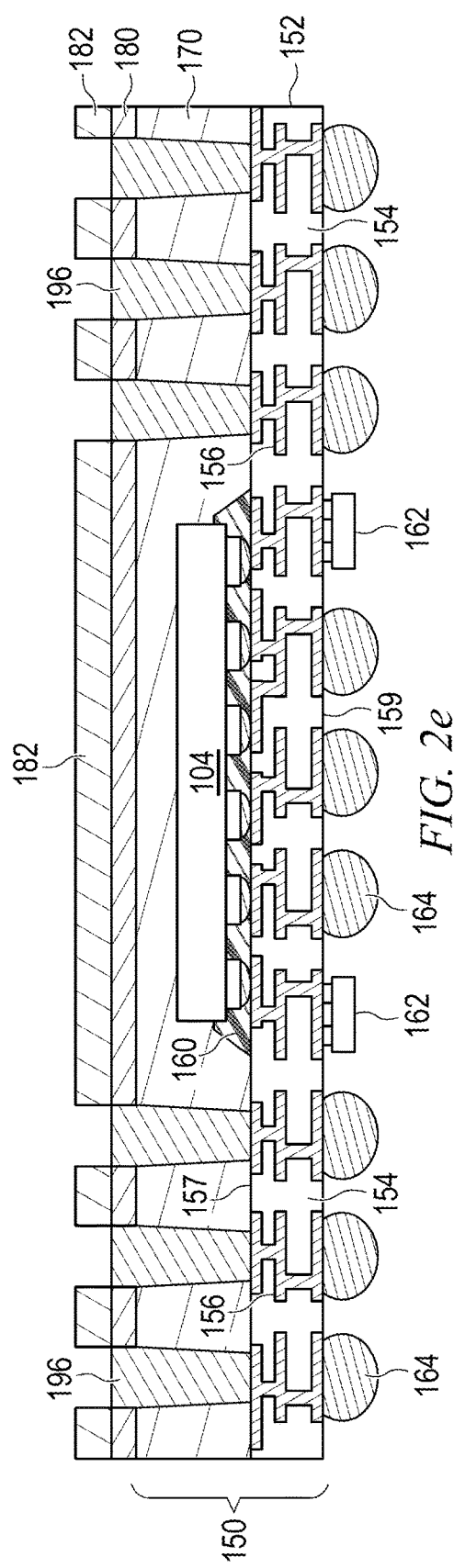

FIG. 2e shows conductive vias 196 formed by depositing a conductive material into via openings 190. Conductive vias 196 can be formed by depositing a conductive epoxy, conductive adhesive, or solder paste. In other embodiments, conductive material is sputtered, sprayed, or plated over cover tape 182 and into via openings 190. The conductive material can be gold, silver, copper, aluminum, steel, or another suitable conductive material. In one embodiment, a product that can be cured at less than 100° C. is selected in order to reduce the amount of heat required, thereby reducing warpage. One example of a suitable conductive adhesive for conductive vias 196 is ABP2032S by Henkel Adhesive Technologies. Conductive vias 196 extend down into via openings 190 to physically and electrically contact conductive layer 156 of substrate 152.

Figure 2F:
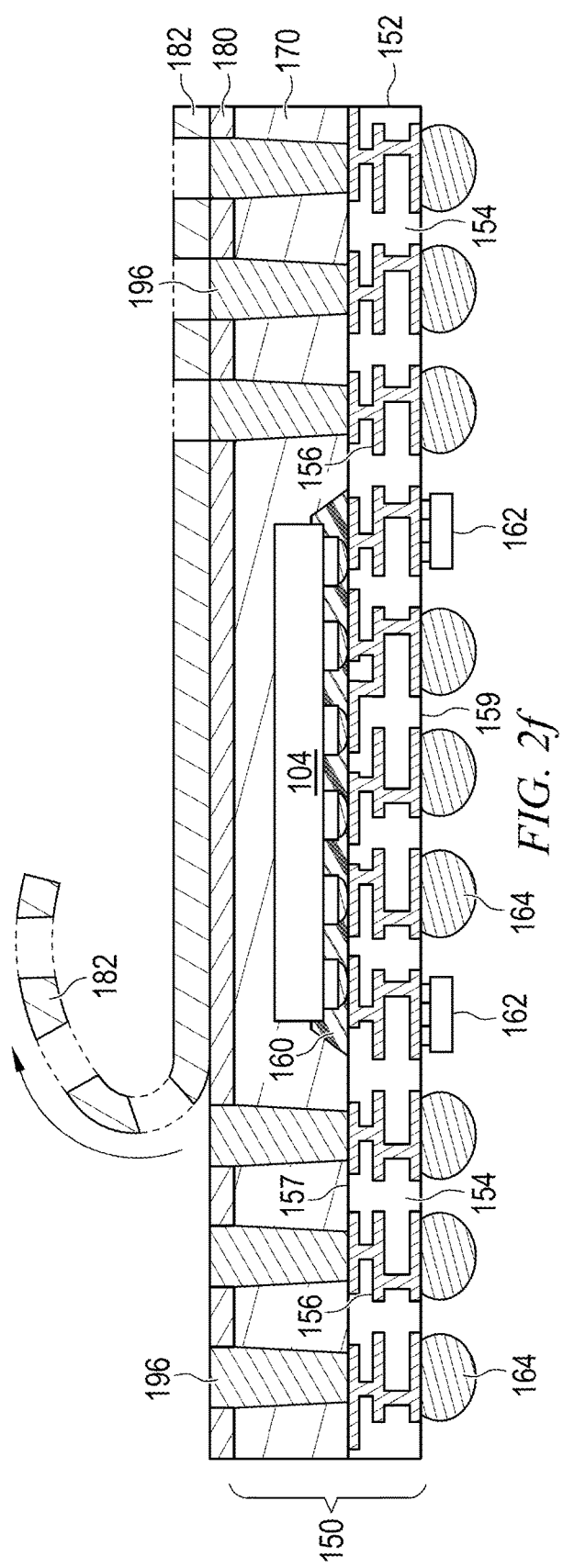

After conductive vias 196 are formed, and cured if needed, cover tape 182 is removed to expose the top adhesive surface of adhesive tape 180, as shown in FIG. 2f. Cover tape 182 would typically be peeled off as illustrated but could be removed chemically or using any other suitable means. In other embodiments, cover tape 182 is not used, and the top surface of adhesive tape 180 is not initially adhesive. An adhesive material is deposited onto tape 182 during this step instead of removing tape 180 to expose a pre-applied adhesive.

Conductive vias 196 are formed with top surfaces coplanar to adhesive tape 180 or slightly recessed. In other embodiments, conductive vias 196 are formed with top surfaces approximately coplanar to or recessed within encapsulant 170. Conductive vias 196 can be formed extending higher than the top surface of tape 180.

Figure 2G:
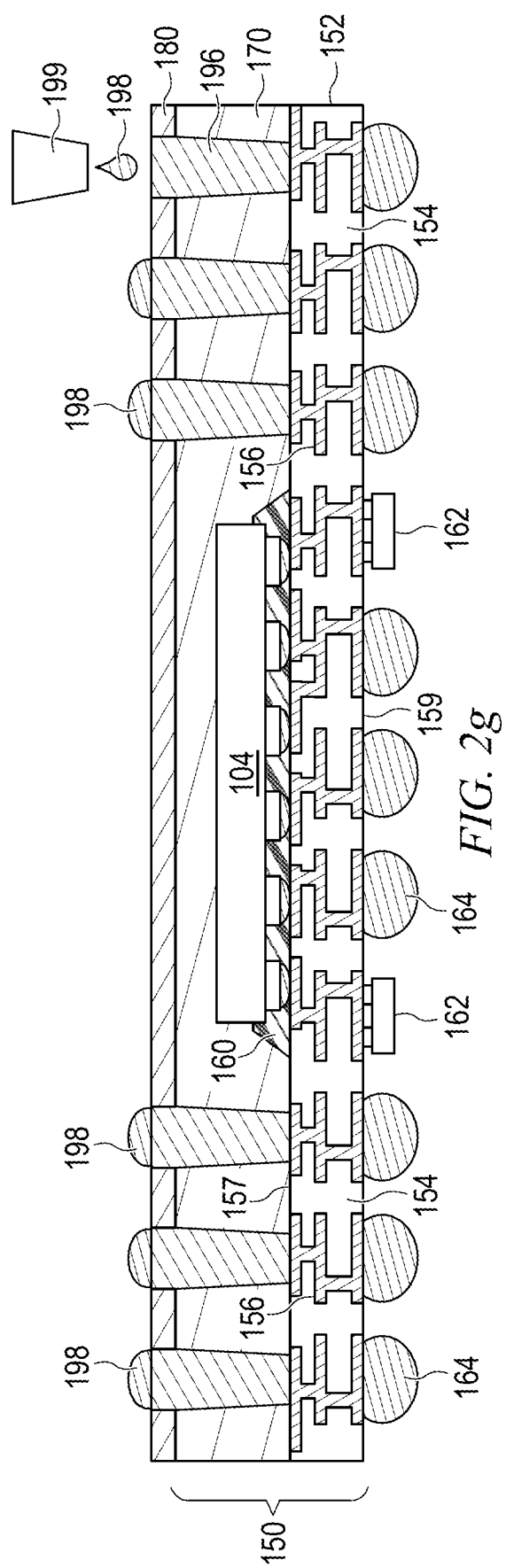

In FIG. 2g, solder paste 198 is printed onto conductive vias 196 using nozzle 199. A stencil controls the distribution of solder paste 198 in some embodiments. Any suitable solder paste printing or deposition method is used in other embodiments.

Figure 2H:
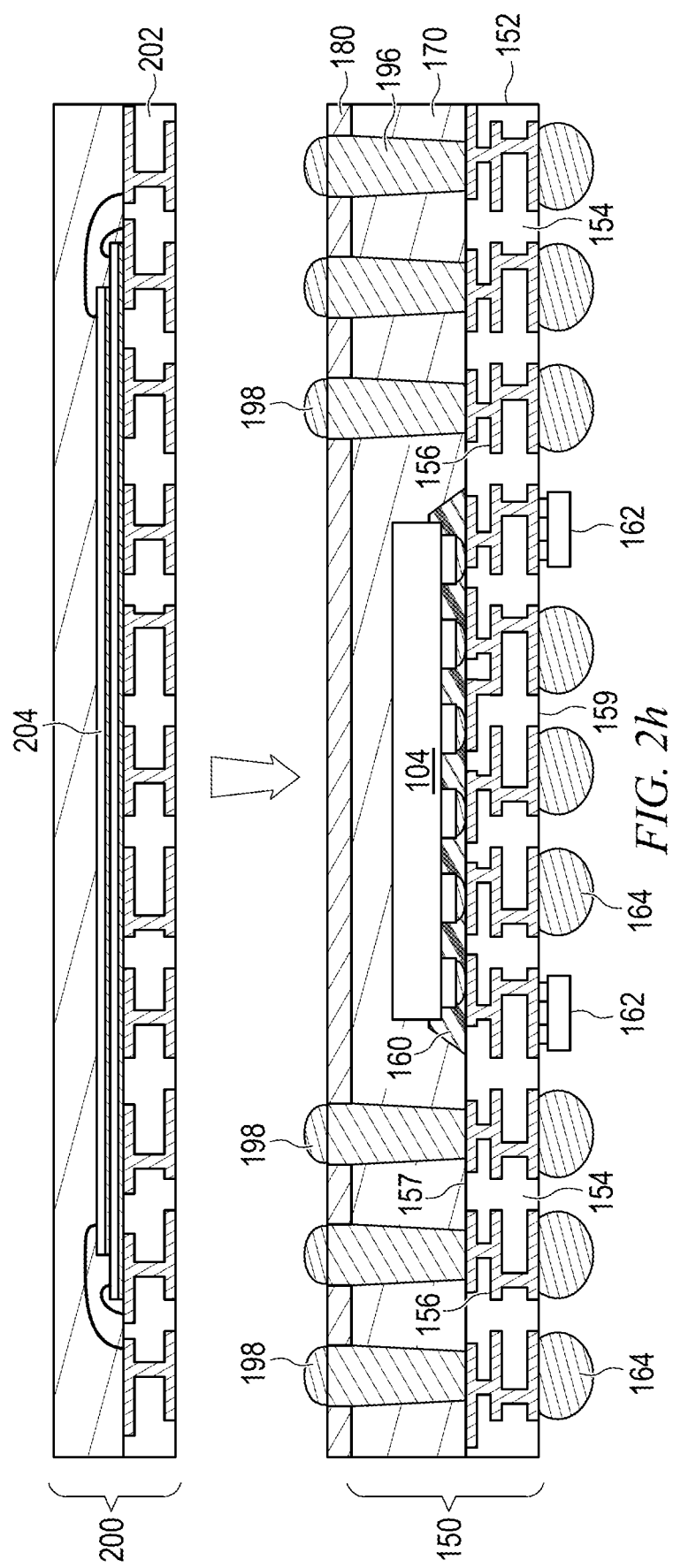
Figure 2I:
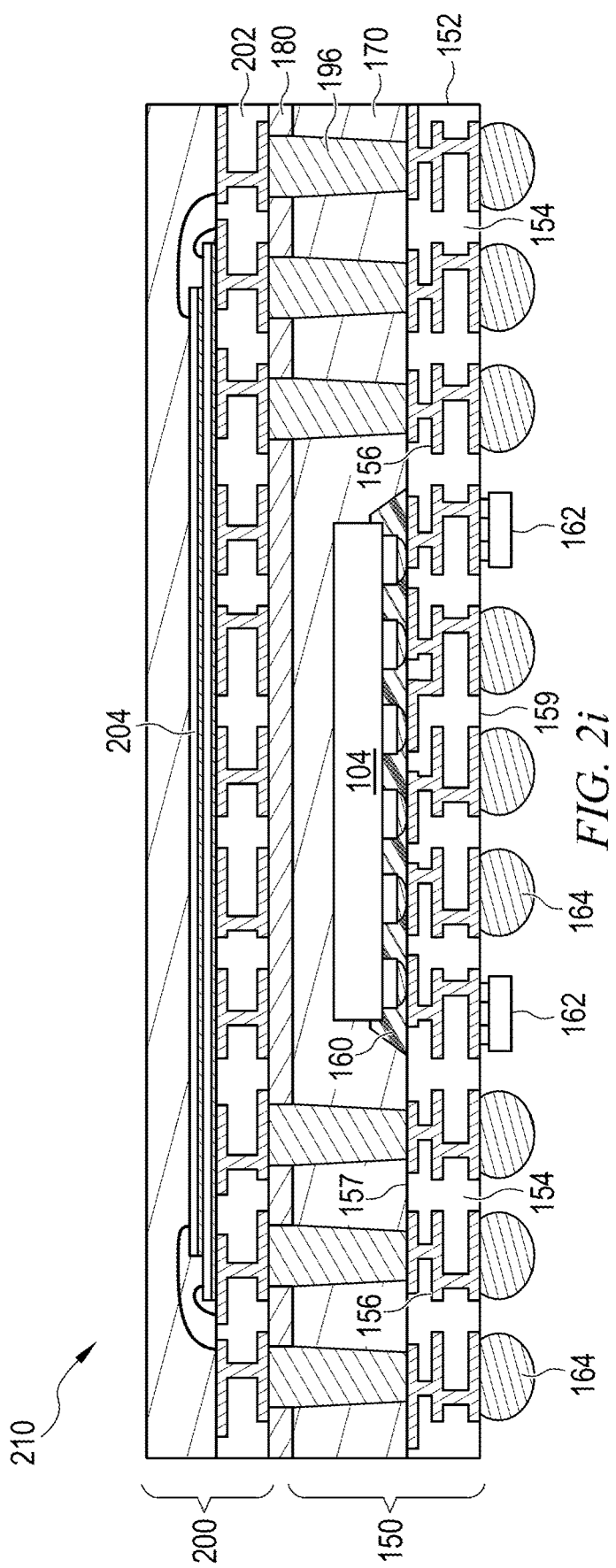

A package-on-package top (PoPt) 200 is disposed over and mounted to PoPb 150 in FIGS. 2h and 2i. PoPt 200 has a similar structure to PoPb 150, including a substrate 202 with an encapsulated semiconductor die 204. PoPt 200 can be any type of semiconductor package with any desired electrical components in other embodiments. Substrate 202 of PoPt 200 is pressed down onto adhesive tape 180, which mechanically bonds PoPt 200 to PoPb 150. The bottom of substrate 202 has a land grid array for interconnection. Contact pads on the bottom of substrate 202 align with the locations where solder paste 198 was printed on conductive vias 196.

PoPb 150 and PoPt 200 can both remain as unsingulated panels of units, and then both are singulated together after mounting. In other embodiments, PoPt 200, PoPb 150, or both are singulated prior to mounting. PoPt 200 and PoPb 150 could each separately be considered semiconductor packages. After combining them, the combination could also be considered a semiconductor package. PoP 210 is a semiconductor package consisting of two stacked semiconductor packages.

FIG. 2i shows PoP 210 completed with PoPt 200 mounted to PoPb 150 and electrically connected by conductive vias 196. Solder paste 198 is reflowed if necessary to improve reliability of the electrical connection. In other embodiments, conductive vias 196 are composed of a conductive adhesive or epoxy that remains uncured or partially cured when PoPt 200 is pressed down onto tape 180. Conductive vias 196 are then cured while physically contacting both substrate 152 and substrate 202 without the need of a separate solder paste 198.

PoP 210 is a complex package type formed using a simple process due to the use of adhesive tape 180 and conductive vias 196. Conductive vias 196 are significantly smaller than copper-cored solder balls, which would commonly be embedded in encapsulant 170 in the prior art instead. Moreover, a separate interposer is not required between PoPt 200 and PoPb 150 like some prior art PoP implementations. Forming via openings 190 with a trench cut allows a significantly finer interconnect pitch than the prior art. The overall process is simpler, cheaper, and with improved warpage characteristics. PoPt 200 and PoPb 150 are stacked using adhesive tape 180 to hold the packages together. A trench cut and fill is used to electrically connect PoPt 200 and PoPb 150.

Figure 3A:
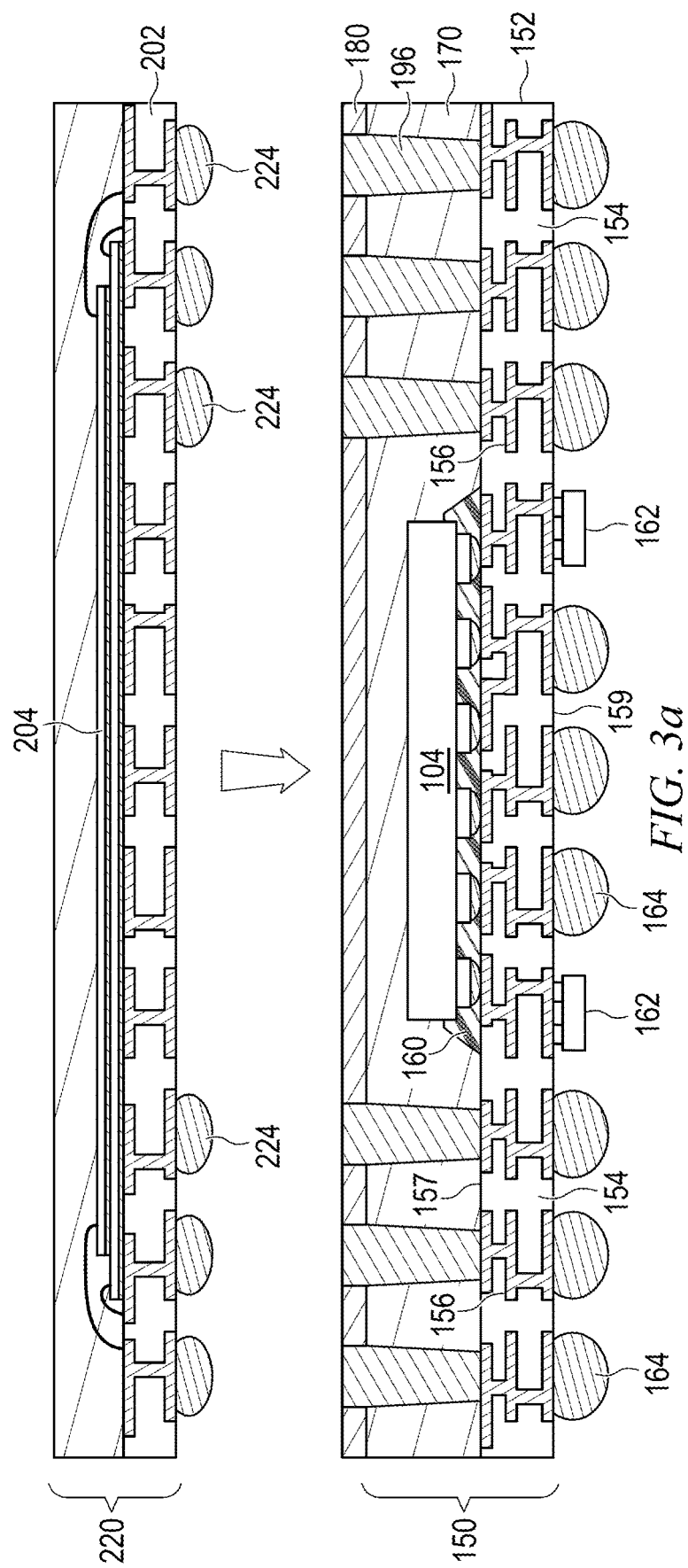
FIGS. 3a and 3b illustrate a package-on-package top having a ball grid array.
Figure 3B:
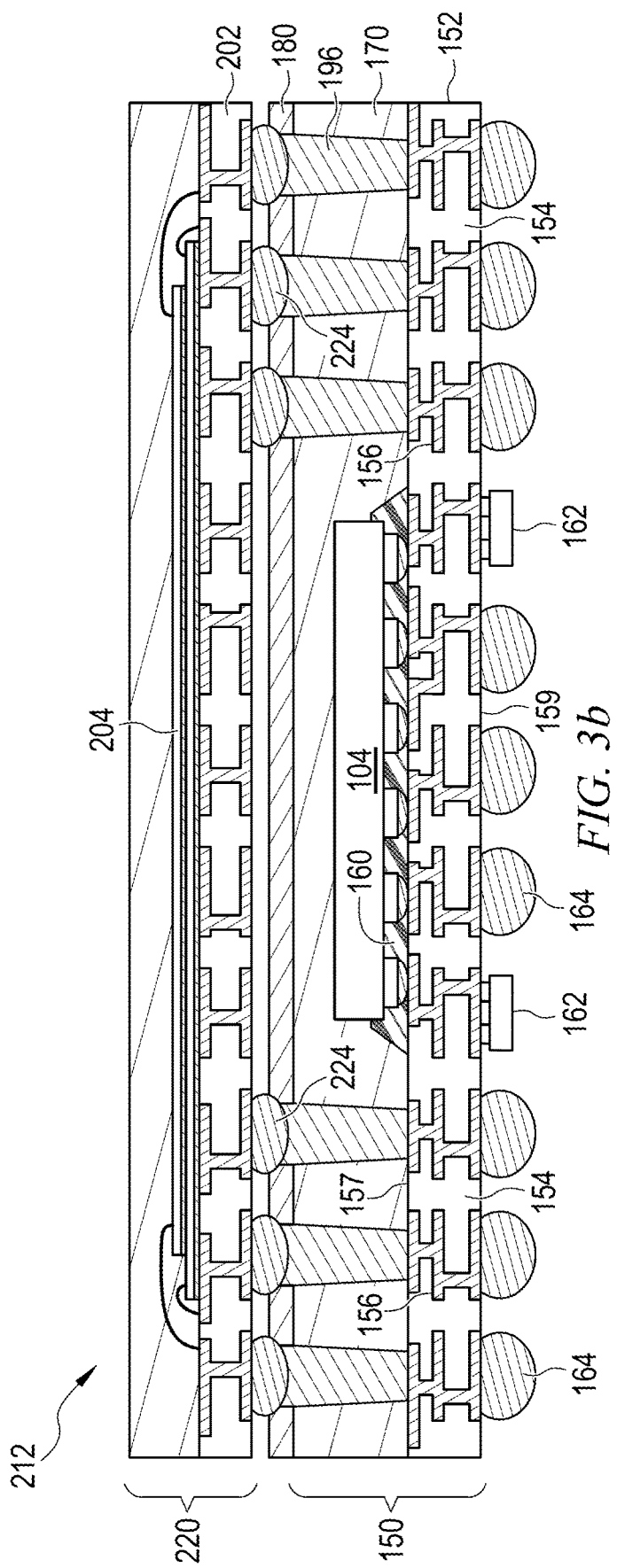

FIGS. 3a and 3b show forming PoP 212 using PoPt 220 with a ball grid array instead of PoPt 200, which had a land grid array. PoPt 220 has conductive bumps 224 formed on the bottom of substrate 202 for electrical interconnect. Bumps 224 can be formed as described above for bumps 114 on semiconductor die 104. PoPt 220 is pressed down onto tape 180 so that the tape adheres to substrate 202. Conductive vias 196 may be recessed to provide additional clearance for bumps 224, thus allowing tape 180 to physically contact substrate 202. An extra thick tape 180 can also be used to provide sufficient height to reach substrate 202 with the additional offset from bumps 224. In some embodiments, a gap remains between substrate 202 and tape 180. Tape attach still helps by keeping PoPt 220 in place, adhering to bumps 224 before the bumps are reflowed to mechanically couple to PoPb 150. A flux material can be printed onto conductive vias 196 similar to how solder paste 198 was printed above to aid in the solder reflow process.

FIGS. 4a-4c show forming a double-sided package with tape attachment. In FIG. 4a, a bottom package 230 has a substrate 231. Adhesive tape 232 and cover tape 234 are disposed on substrate 231. Bottom package 230 further has solder bumps 236 formed on substrate 231 in openings of encapsulant 238.

In FIG. 4b, openings 235 are formed through cover tape 234 and adhesive tape 232 to expose contact pads of substrate 231 below the tapes. Openings 235 are formed by trench cut as described above. Openings 235 are formed only through adhesive tape 232 and cover tape 234. There is no additional encapsulant as in the above embodiments because adhesive tape 232 is disposed directly on substrate 231.

In FIG. 4c, conductive vias 239 are formed by filling openings 235 with a conductive material as described above for conductive vias 196. Double-sided package 241 is completed by mounting top package 240 onto adhesive tape 232 with substrate 243 contacting the adhesive tape. Substrate 243 has a land grid array but could also have a ball grid array. Top package 243 includes semiconductor die 104 and discrete active or passive components 242 molded in encapsulant 244. Any combination of suitable electrical components can be used as a part of bottom package 230 and top package 240 in any desired configuration.

Double-sided package 241 has top package 240 and bottom package 230 disposed with their respective substrates oriented toward each other unlike previous embodiments in which both substrates were oriented in the same direction. Bottom package 230 and top package 240 can both remain as unsingulated panels of units, and then both are singulated together after mounting. In other embodiments, top package 230, bottom package 240, or both are singulated prior to mounting.

Figure 5:
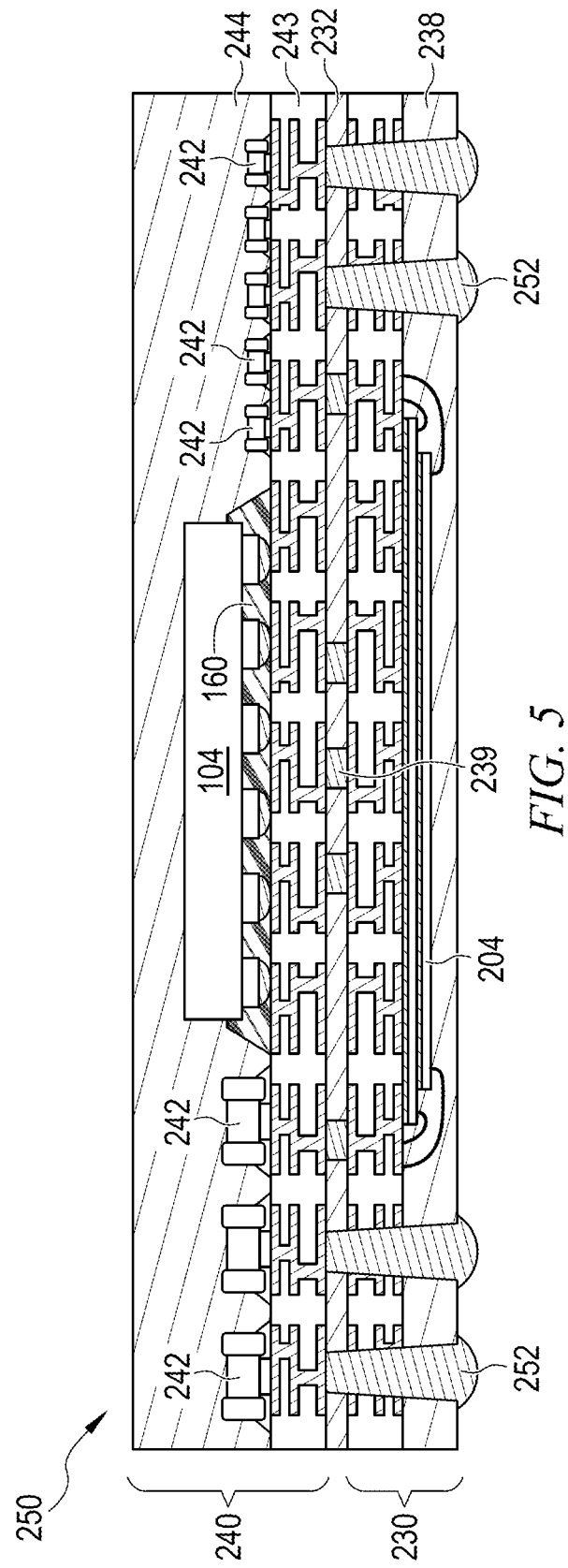
FIG. 5 illustrates another double-sided embodiment.

FIG. 5 shows a double-sided package 250, which adds conductive vias or bumps 252 relative to double-sided package 241. Via openings for conductive bumps 252 can be formed by mechanical, chemical, or laser etching or drilling through bottom package 230 before or after top package 240 is mounted to the bottom package. Solder or another conductive material is deposited into the via openings to form conductive bumps 252. Conductive bumps 252 extend from substrate 243 of top package 240, all the way through bottom package 230, and extend beyond the bottom-most surface of the bottom package.

Figure 6:
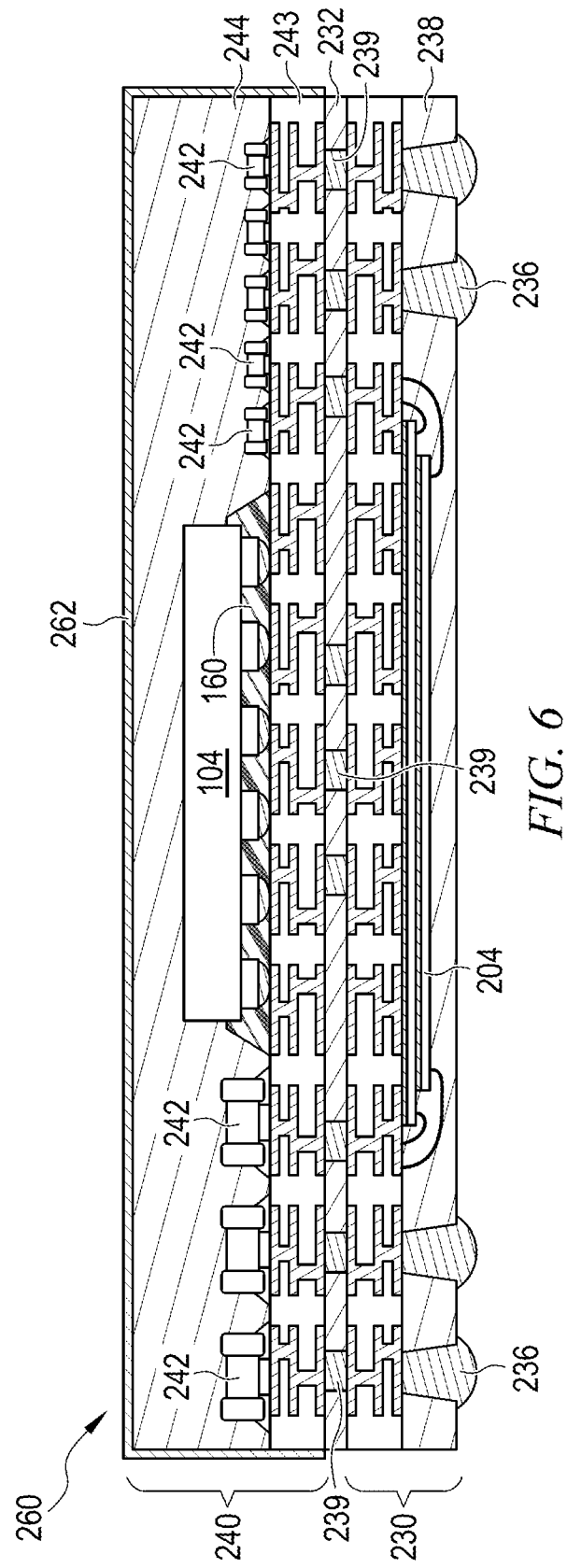
FIG. 6 illustrates a shielded embodiment.

FIG. 6 shows double-sided package 260 with shielding layer 262 formed over top package 240. Shielding layer 262 is formed using any suitable metal deposition technique, e.g., chemical vapor deposition, physical vapor deposition, other sputtering methods, spraying, or plating. The sputtered material can be copper, steel, aluminum, gold, titanium, combinations thereof, or any other suitable conductive material. In some embodiments, shielding layer 262 can be made by sputtering on multiple layers of differing material, e.g., stainless steel-copper-stainless steel or titanium-copper. Shielding layer 262 reduces electromagnetic interference (EMI) between the components of package 260 and other nearby electronic devices.

Shielding layer 262 is formed on side surfaces of encapsulant 244 and substrate 243. Shielding layer 262 is optionally connected to ground voltage through conductive layers of substrate 243, which can be exposed at side surfaces of substrate 243. Shielding layer 262 is formed prior to mounting top package 240 on bottom package 230 so that the shielding layer is only formed on top package 240. In other embodiments, shielding layer 262 is formed after package 260 is complete so that the shielding layer extends down to bottom package 230. Any of the above embodiments can have a shielding layer formed in a similar manner.

Figure 7A:
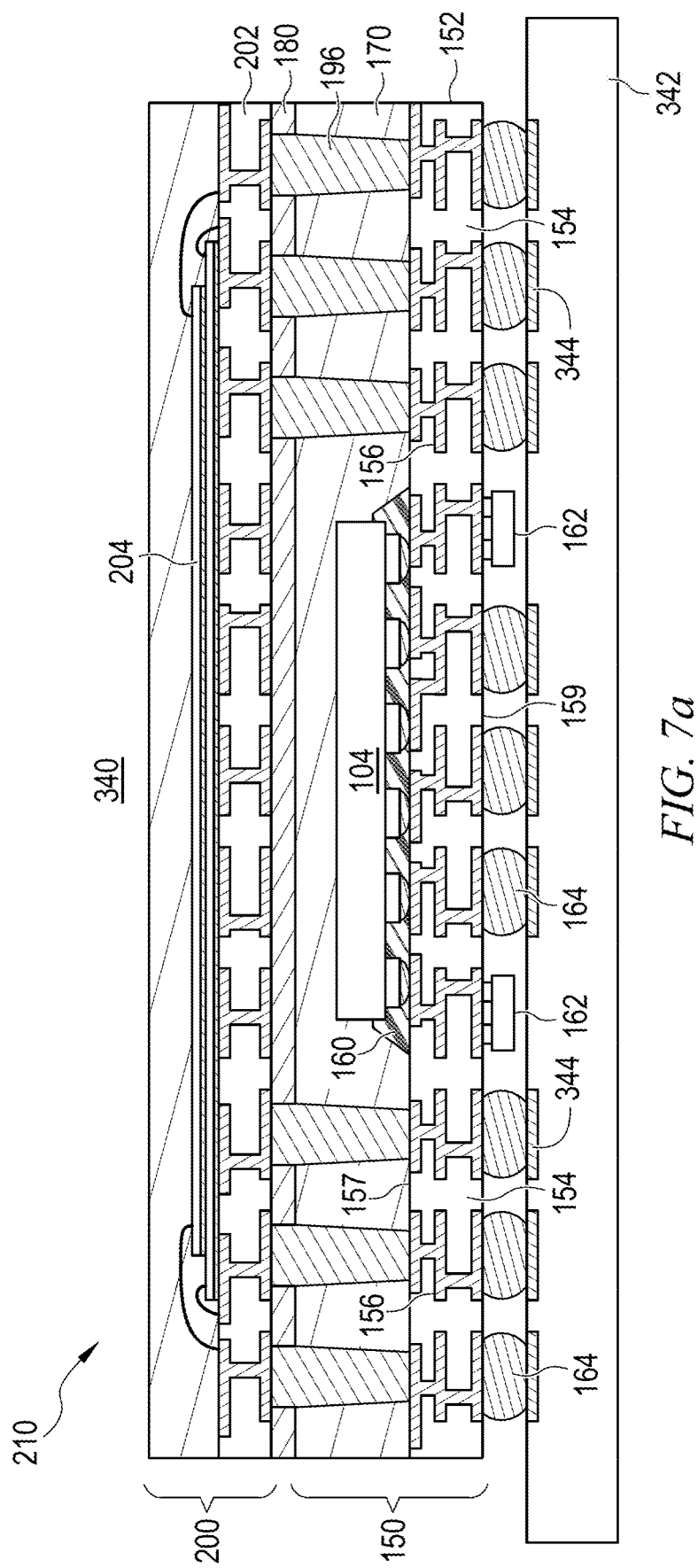
FIGS. 7a and 7b illustrate integrating the shielded semiconductor packages into an electronic device.
Figure 7B:
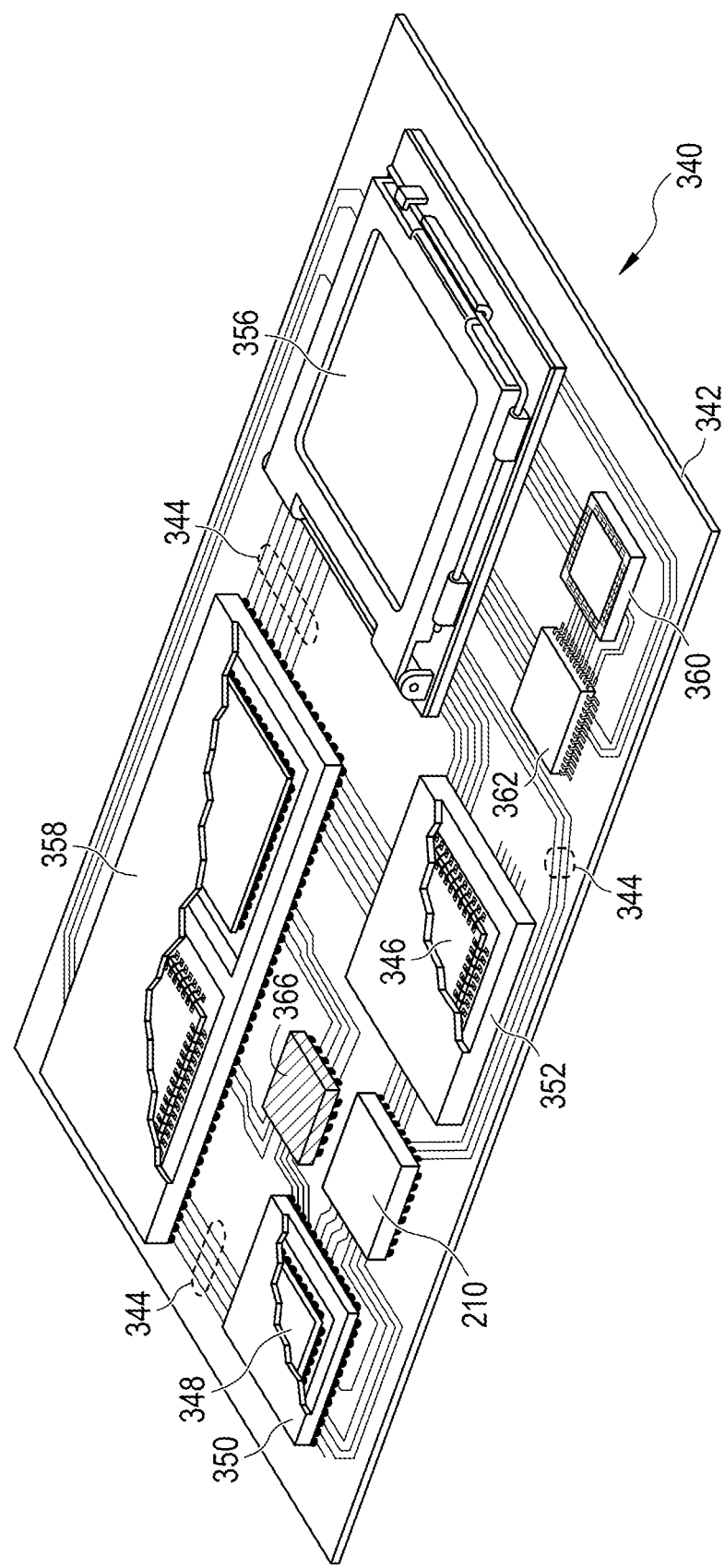

FIGS. 7a and 7b illustrate integrating the above-described semiconductor packages, e.g., PoP 210, into a larger electronic device 340. FIG. 7a illustrates a partial cross-section of PoP 210 mounted onto a printed circuit board (PCB) or other substrate 342 as part of electronic device 340. Bumps 164 are reflowed onto conductive layer 344 of PCB 342 to physically attach and electrically connect PoP 210 to the PCB. In other embodiments, thermocompression or other suitable attachment and connection methods are used. In some embodiments, an adhesive or underfill layer is used between PoP 210 and PCB 342. Semiconductor die 104 and 204 are electrically coupled to conductive layer 344 through substrates 152 and 202.

FIG. 7b illustrates electronic device 340 including PCB 342 with a plurality of semiconductor packages mounted on a surface of the PCB, including PoP 210. Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 366 are shown mounted on PCB 342 along with PoP 210. Conductive traces 344 electrically couple the various packages and components disposed on PCB 342 to PoP 210, giving use of the components within PoP 210 to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a first semiconductor package including a substrate and an encapsulant deposited over the substrate;
disposing an adhesive tape on the encapsulant;
forming a conductive via by trench cutting through the adhesive tape and encapsulant to expose the substrate;
disposing a solder paste on the conductive via; and
disposing a second semiconductor package over the adhesive tape opposite the first semiconductor package, wherein the first semiconductor package and second semiconductor package are bonded together by the adhesive tape.

2. The method of claim 1, further including disposing the adhesive tape on the encapsulant with a cover tape attached to the adhesive tape.

3. The method of claim 1, wherein forming the conductive via includes depositing a conductive epoxy or adhesive into an opening formed by the trench cutting.

4. The method of claim 1, wherein each of the first semiconductor package and second semiconductor package physically contacts the adhesive tape.

5. The method of claim 1, further including forming a shielding layer over the second semiconductor package prior to disposing the second semiconductor package over the adhesive tape opposite the first semiconductor package.

6. A method of making a semiconductor device, comprising:
   providing a first semiconductor package;
   disposing an adhesive tape over the first semiconductor package;
   forming a conductive via through the adhesive tape;
   removing a cover tape of the adhesive tape after forming the conductive via; and
   disposing a second semiconductor package over the first semiconductor package with the second semiconductor package electrically coupled to the first semiconductor package through the conductive via.

7. The method of claim 6, further including forming the conductive via using a conductive epoxy or adhesive.

8. The method of claim 7, further including curing the conductive epoxy or adhesive after disposing the second semiconductor package over the first semiconductor package.

9. The method of claim 6, further including disposing the adhesive tape on a substrate of the first semiconductor package.

10. The method of claim 9, further including disposing the second semiconductor package with a substrate of the second semiconductor package in physical contact with the adhesive tape.

11. The method of claim 6, further including forming the conductive via through an encapsulant of the first semiconductor package.

12. A method of making a semiconductor device, comprising:
   providing a first semiconductor package including a substrate and an encapsulant deposited over the substrate;
   disposing an adhesive tape over the first semiconductor package;
   forming a via opening through the adhesive tape and encapsulant to expose the substrate;
   forming a conductive via by completely filling the via opening with a conductive material;
   disposing a second semiconductor package over the first semiconductor package with the adhesive tape between the first semiconductor package and second semiconductor package after forming the conductive via; and
   pressing the second semiconductor package onto the adhesive tape, wherein the adhesive tape mechanically bonds the second semiconductor package to the first semiconductor package.

13. The method of claim 12, further including forming a shielding layer over the first semiconductor package.

14. The method of claim 12, wherein the first semiconductor package and second semiconductor package are bonded together by the adhesive tape.

15. The method of claim 12, further including forming the via opening using a trench cut.

16. A semiconductor device, comprising:
   a first semiconductor package;
   a second semiconductor package;
   an adhesive tape disposed between the first semiconductor package and second semiconductor package, wherein a substrate of the second semiconductor package physically contacts the adhesive tape;
   a conductive via formed through the adhesive tape and an encapsulant of the first semiconductor package; and
   a solder paste disposed on the conductive via between the first semiconductor package and second semiconductor package.

17. The semiconductor device of claim 16, wherein the conductive via includes a conductive epoxy or adhesive.

18. The semiconductor device of claim 16, wherein the adhesive tape extends from a substrate of the first semiconductor package to a substrate of the second semiconductor package.

19. The semiconductor device of claim 16, further including a shielding layer formed over the first semiconductor package.

* * * * *